United States Patent
Pozzati et al.

(10) Patent No.: US 8,981,773 B2
(45) Date of Patent: Mar. 17, 2015

(54) MAGNETORESISTIVE SENSOR WITH REDUCED PARASITIC CAPACITANCE, AND METHOD

(75) Inventors: Enrico Pozzati, Cava Manara (IT); Fabio Bottinelli, Malnate (IT); Carlo Alberto Romani, Cornaredo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 440 days.

(21) Appl. No.: 13/338,069

(22) Filed: Dec. 27, 2011

(65) Prior Publication Data

US 2012/0161759 A1  Jun. 28, 2012

(30) Foreign Application Priority Data

Dec. 27, 2010 (IT) .............................. TO2010A1067

(51) Int. Cl.
*G01R 33/02* (2006.01)
*G01R 33/00* (2006.01)
*B82Y 25/00* (2011.01)
*G01R 33/09* (2006.01)

(52) U.S. Cl.
CPC ............. *G01R 33/0005* (2013.01); *B82Y 25/00* (2013.01); *G01R 33/093* (2013.01)
USPC .......................................... 324/252; 324/260

(58) Field of Classification Search
CPC ............. G01R 33/0005; G01R 33/093; G01R 33/096; B82Y 25/00; H01L 43/14; H01L 2924/00
See application file for complete search history.

(56) References Cited

U.S. PATENT DOCUMENTS

| | | | |
|---|---|---|---|
| 4,847,584 A | 7/1989 | Pant | |
| 5,247,278 A | 9/1993 | Pant et al. | |
| 5,952,825 A | 9/1999 | Wan | |
| 6,020,738 A * | 2/2000 | Van Den Berg et al. | 324/252 |
| 6,556,007 B1 | 4/2003 | Abe et al. | |
| 6,707,298 B2 | 3/2004 | Suzuki et al. | |
| 6,717,403 B2 | 4/2004 | Witcraft et al. | |
| 6,850,057 B2 | 2/2005 | Witcraft et al. | |
| 7,057,173 B2 | 6/2006 | Wright | |
| 7,138,798 B1 | 11/2006 | Abe et al. | |
| 7,816,905 B2 * | 10/2010 | Doogue et al. | 324/117 H |
| 7,990,139 B2 | 8/2011 | Abe et al. | |
| 8,115,286 B2 * | 2/2012 | Zhang et al. | 257/676 |
| 2004/0111906 A1 | 6/2004 | Abe et al. | |
| 2007/0262773 A1 * | 11/2007 | Witcraft et al. | 324/252 |
| 2008/0258722 A1 | 10/2008 | Zon et al. | |

* cited by examiner

*Primary Examiner* — Minh N Tang
(74) *Attorney, Agent, or Firm* — Seed IP Law Group PLLC

(57) ABSTRACT

A magnetic-field sensor adapted to detect an external magnetic field. The magnetic-field sensor including a first chip, having a first magnetoresistive structure for detection of the external magnetic field, the first magnetoresistive detection structure including an electrical-contact pad and magnetoresistive element, and a second chip housing an integrated electronic circuit and a magnetic-field generator. The first and second chips being mutually arranged in such a way that the integrated electronic circuit can be electrically coupled to the electrical-contact pad of the magnetoresistive structure and in such a way that the magnetic-field generator can be magnetically coupled to the magnetoresistive structure.

21 Claims, 7 Drawing Sheets

MAGNETORESISTIVE SENSOR WITH REDUCED PARASITIC CAPACITANCE, AND METHOD

BACKGROUND

1. Technical Field

The present disclosure relates to a magnetic-field sensor, in particular to a sensor that uses anisotropic magnetoresistive (AMR) elements in order to detect a magnetic field that is external to the sensor and acts on the sensor itself.

2. Description of the Related Art

Magnetic-field sensors, in particular AMR sensors based upon anisotropic magnetoresistance, are used in a plurality of applications and systems, for example in compasses, in systems for detection of ferromagnetic materials, in the detection of currents, and in a wide range of other applications, thanks to their capacity for detecting natural magnetic fields (for example, the Earth's magnetic fields) and magnetic fields generated by electrical components (such as electrical or electronic devices and lines traversed by electric current).

The phenomenon of anisotropic magnetoresistivity occurs within particular ferromagnetic materials, which, when subjected to an external magnetic field, undergo a variation of resistivity as a function of the characteristics of the magnetic field applied. Usually, said materials are shaped in thin strips so as to form resistive elements, and the resistive elements thus formed are electrically connected together to form a bridge structure (typically a Wheatstone bridge).

Moreover known to the art is the production of AMR sensors with standard techniques of micromachining of semiconductors, as described, for example, in U.S. Pat. No. 4,847, 584. In particular, each magnetoresistive element can be formed by a film of magnetoresistive material, such as for example Permalloy (a ferromagnetic alloy containing iron and nickel), deposited to form a thin strip on a substrate made of semiconductor material, for example, silicon.

When an electric current is made to flow through a magnetoresistive element, the angle $\theta$ between the direction of magnetization of said magnetoresistive element and the direction of the flow of the current affects the effective value of resistivity of the magnetoresistive element itself so that, as the value of the angle $\theta$ varies, the value of electrical resistance varies (in detail, said variation follows a law of the $\cos^2\theta$ type). For example, a direction of magnetization parallel to the direction of the flow of current results in a maximum value of resistance to the passage of current through the magnetoresistive element, whereas a direction of magnetization orthogonal to the direction of the flow of current results in a minimum value of resistance to the passage of current through the magnetoresistive element.

AMR sensors further include a plurality of straps integrated in the sensors themselves, typically two straps, known as "set/reset strap" and "offset strap", which are designed to generate, when traversed by a current of an appropriate value, a magnetic field that couples in a direction perpendicular to the direction of detection of the sensors and in the direction of detection of the sensors, respectively; in this regard, see for example U.S. Pat. No. 5,247,278.

The set/reset strap has the function of varying, alternating it, the orientation of magnetization of the magnetoresistive elements in a first pre-defined direction (the so-called "easy axis" or EA). In use, the variation of the sense of magnetization is obtained by applying to the magnetoresistive element, via the set/reset strap, a magnetic field of an appropriate value for a short period of time, such as to force arbitrarily the orientation of the magnetic dipoles of the magnetoresistive element in the first pre-defined direction and with a certain sense ("set" operation), and then by applying to the magnetoresistive element a second magnetic field, similar to the previous one but with opposite sense, so as to force the orientation of the magnetic dipoles of the magnetoresistive element once again in the first pre-defined direction, but with a sense opposite with respect to the previous one ("reset" operation). The set and reset operations have the function of bringing each magnetoresistive element of the AMR sensor in a respective single-domain state before operating the AMR sensor, for example in order to carry out operations of sensing of an external magnetic field. The set and reset operations are used because as only in the single-domain state are the fundamental properties of linearity, sensitivity, and stability of the magnetoresistive elements controlled and repeatable. The aforementioned set and reset operations are known and described in detail for example in the document No. U.S. Pat. No. 5,247,278.

The offset strap is normally used for operations of compensation of the offset present in the AMR sensor (on account of mismatch in the values of the corresponding electrical components), and/or self-test operations, and/or operations of calibration of the AMR sensor. In particular, the value of the electrical quantities at output from the AMR sensor is, in the presence of the offset strap, a function both of the external magnetic field to be detected and of the magnetic field generated as a result of a current circulating in the offset strap. The offset strap is formed by turns of conductive material, for example metal, set on the same substrate as that on which the magnetoresistive elements of the sensor and the set/reset strap are provided (in different metal layers), and is electrically insulated from, and set in the proximity of, said magnetoresistive elements. The magnetic field generated by the offset strap generates a magnetic field component that tends to shift the orientation of the magnetic dipoles of each magnetoresistive element in a second pre-defined direction (the so-called "hard axis" or HA), orthogonal to the first pre-defined direction, which is the direction of sensitivity of the sensor.

FIG. 1 shows, in top plan view, a layout provided by way of example of an integrated circuit for a magnetic-field sensor 1 of a known type, comprising a plurality of magnetoresistive elements, connected to one another so as to form a Wheatstone bridge, for example as described in U.S. Pat. Nos. 5,247,278 and 5,952,825, and obtained, for example, as described in U.S. Pat. No. 4,847,584.

More in particular, each magnetoresistive element has a structure of the barber-pole type. The barber-pole structure for magnetoresistive elements is known, for example, from U.S. Pat. No. 6,850,057. In this case, each magnetoresistive element is in ohmic contact with a plurality of biasing elements with high electrical conductivity (for example, ones made of aluminium, copper, silver, or gold). The biasing elements are arranged inclined by a certain angle $\alpha$ (typically, $\alpha=45°$) with respect to the axis of spontaneous magnetization of the magnetoresistive element.

The magnetic-field sensor 1 is formed on a semiconductor substrate 2 by means of micromachining processes of a known type. Four magnetoresistive elements 4, 6, 8, and 10, in the form of strips of ferromagnetic material (for example, deposited thin film comprising an Ni/Fe alloy), in a barber-pole configuration, are arranged to form a Wheatstone bridge. With reference to FIG. 1, the magnetoresistive elements 4, 6, 8, 10 are interconnected to one another and connected to pads 21, 22, 23, 24, and 25. The pad 21 is connected to the magnetoresistive element 4 by means of a conductive path 11, and the magnetoresistive element 4 is connected to the magnetoresistive element 6 by means of a conductive portion 17.

The conductive portion 17 is electrically connected to the pad 22 by means of a respective conductive path 12. The magnetoresistive element 6 is then connected to the magnetoresistive element 10 by means of a conductive portion 18, and the conductive portion 18 is electrically connected to the pad 23 by means of a respective conductive path 13. The magnetoresistive element 10 is interconnected to the magnetoresistive element 8 by means of a conductive portion 16, and the conductive portion 16 is electrically connected to the pad 24 by means of a respective conductive path 14. The pad 25 is connected to the magnetoresistive element 8 by means of a conductive portion 15.

A resistive Wheatstone-bridge structure is thus formed, which provides a magnetic-field sensor 1 sensitive to components of magnetic field having a direction perpendicular to the strips of ferromagnetic material that form the magnetoresistive elements 4, 6, 8, 10. The pad 21 is connected to the pad 25, to form a common pad so as to connect the magnetoresistive element 4 and the magnetoresistive element 8 electrically together (in FIG. 1 said pads 21, 25 are shown separated for reasons of optimization of the layout).

In use, an input voltage Vin is applied between the pad 22 and the pad 24. Reading of the output voltage Vout is made between the pad 21 (common to the pad 25) and the pad 23.

With reference to FIG. 1, the magnetic-field sensor 1 further comprises a first strip of electrically conductive material extending on the substrate 2 and insulated from the latter by means of a layer of dielectric material (not shown in detail in the figure). Said first strip of electrically conductive material forms a first winding 19, of a planar type, which extends in a plane parallel to the plane in which the magnetoresistive elements 4, 6, 8, 10 lie, electrically insulated from the magnetoresistive elements 4, 6, 8, 10.

The magnetic-field sensor 1 further comprises a second strip of electrically conductive material, extending on the substrate 2 and insulated from the latter and from the first winding 19 by means of a layer of dielectric material (not shown in detail in the figure). Said second strip of electrically conductive material forms a second winding 20, of a planar type, which extends between a terminal 20a and a terminal 20b in a plane parallel to the plane in which the magnetoresistive elements 4, 6, 8, 10 and the first winding 19 lie, and is electrically insulated from the magnetoresistive elements 4, 6, 8, 10 and from the first winding 19.

The first winding 19 is used when it is desired to generate a magnetic field of known intensity interacting with the magnetic-field sensor 1, for example with purposes of self-testing of the sensor, biasing, calibration, and/or compensation of possible offsets due to the presence of undesirable external magnetic fields. In the latter case, the effect of the magnetic field generated by the first winding 19 on the output signal Vout of the magnetic-field sensor 1 is that of balancing the output signal due exclusively to the undesirable external field in order to generate a zero output signal.

In use, when the first winding 19 is traversed by electric current, a magnetic field is generated, the lines of force of which have a direction along the axis of sensitivity of the magnetoresistive elements 4, 6, 8, 10.

On account of the variability of the process of fabrication of the magnetoresistive elements 4, 6, 8, 10, said magnetoresistive elements 4, 6, 8, 10 can have structural characteristics that differ from one another. Once the bridge is supplied, these different characteristics, which can be equated to differences of resistance on the four branches of the bridge, generate an offset voltage Voff between the output terminals of the bridge. This voltage Voff does not have any relationship with the magnetic field that is to be detected but adds, in an undesirable way, to the signal generated by the transduction of the magnetic field that is to be detected in voltage. The offset voltage Voff can be of the order of the output voltage expected from the magnetic fields that are to be detected, and sometimes even greater. The offset signal Voff can be isolated and removed by appropriately using the second winding 20, during reading of the output signal Vout. In greater detail, in use, current pulses of a high value are made to flow in the second winding 20, in opposite directions with respect to one another (by appropriately biasing the terminals 20a and 20b of the second winding) so as to generate respective magnetic fields defined by respective lines of field having a sense opposite to one another. Said magnetic fields have an intensity such as to re-orient the magnetic dipoles of the magnetoresistive elements 4, 6, 8, 10 according to the lines of field generated, in particular with orientation defined by the orientation of the lines of the magnetic field generated. The effect of this orientation of the magnetic dipoles is basically to change the sign to the sensitivity of the sensor. For what has been said, instead, the offset signal Voff, which has purely electrical origins, is not affected by this change of orientation of the magnetic dipoles.

Following upon a first current pulse (referred to as "set pulse") through the second winding 20, a first magnetic field $B_{S1}$ is generated such as to orient the magnetic dipoles of the magnetoresistive elements 4, 6, 8, 10 according to a first sense. A first reading of the output signal Vout of the sensor is then made.

Following upon a second current pulse (referred to as "reset pulse") through the second winding 20, a second magnetic field $B_{S2}$ is generated (of intensity, for example, equal to that of the first magnetic field BO such as to orient the magnetic dipoles of the magnetoresistive elements 4, 6, 8, 10 in a second sense. A second reading of the output signal of the sensor is made. If the first and second readings are available and the difference is made between the values obtained from said readings, the offset signal Voff is erased, and it is thus possible to discriminate just the component of magnetic origin of the signal.

In order for the AMR sensor of FIG. 1 to be operated as described, it is coupled with an appropriate circuitry for power supply and generation and acquisition of signals (in order to supply the set/reset and offset straps and to acquire and process the output voltage signal Vout). For this purpose, electrical connections are provided that are designed to carry supply signals (e.g., input voltage Vin) to the pads 22 and 24, and acquire output signals (e.g., output voltage Vout) from the pads 21, 23 and 25.

Generally, the circuitry designed to generate the supply signal Vin and the output signal Vout is implemented in integrated form (for example, as ASIC) on a chip different from the chip on which the AMR sensor is formed. The connections between the chip carrying the circuitry for power supply and generation and acquisition of signals and the terminals of the AMR sensor are consequently formed by means of wire bonding or else using flip-chip techniques, through bumps. As may be clearly appreciated from FIG. 1, given a sensitive part having all things considered contained dimensions, the overall area of the magnetic sensor may be considerably larger on account of the presence of the straps, in particular the set/reset strap, and on account of the presence of the pads for communication between the sensor and the control/acquisition electronics. In addition, the process (which is relatively simple) of deposition of the ferromagnetic material, is rendered burdensome by numerous successive process steps to provide various metal levels, considerably increasing the manufacturing costs in terms of number of masks and process cost (machinery, process steps, manufacturing times). In addition, given the presence of current peaks of a high value, there may arise problems due to the contacts, in particular on account of generation of parasitic signals (parasitic currents and voltages, parasitic capacitances, etc.), and/or problems of reliability of the contacts provided by means of bonding and/or using bumps, which can jeopardize proper operation of the sensor.

What has been said must consequently be taken into account in the design of the AMR sensor and in the analysis of the output signal Vout acquired from the latter by the acquisition circuitry, which causes an increase of the hardware and/or software complexity of the AMR sensor and/or of the circuitry for power supply and generation and acquisition of signals.

BRIEF SUMMARY

Some embodiments of the present disclosure are a magnetic-field sensor and a corresponding manufacturing method that are free from the disadvantages of the known art, highlighted previously.

According to the present disclosure, a magnetic-field sensor and a corresponding manufacturing method are provided, as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 2:
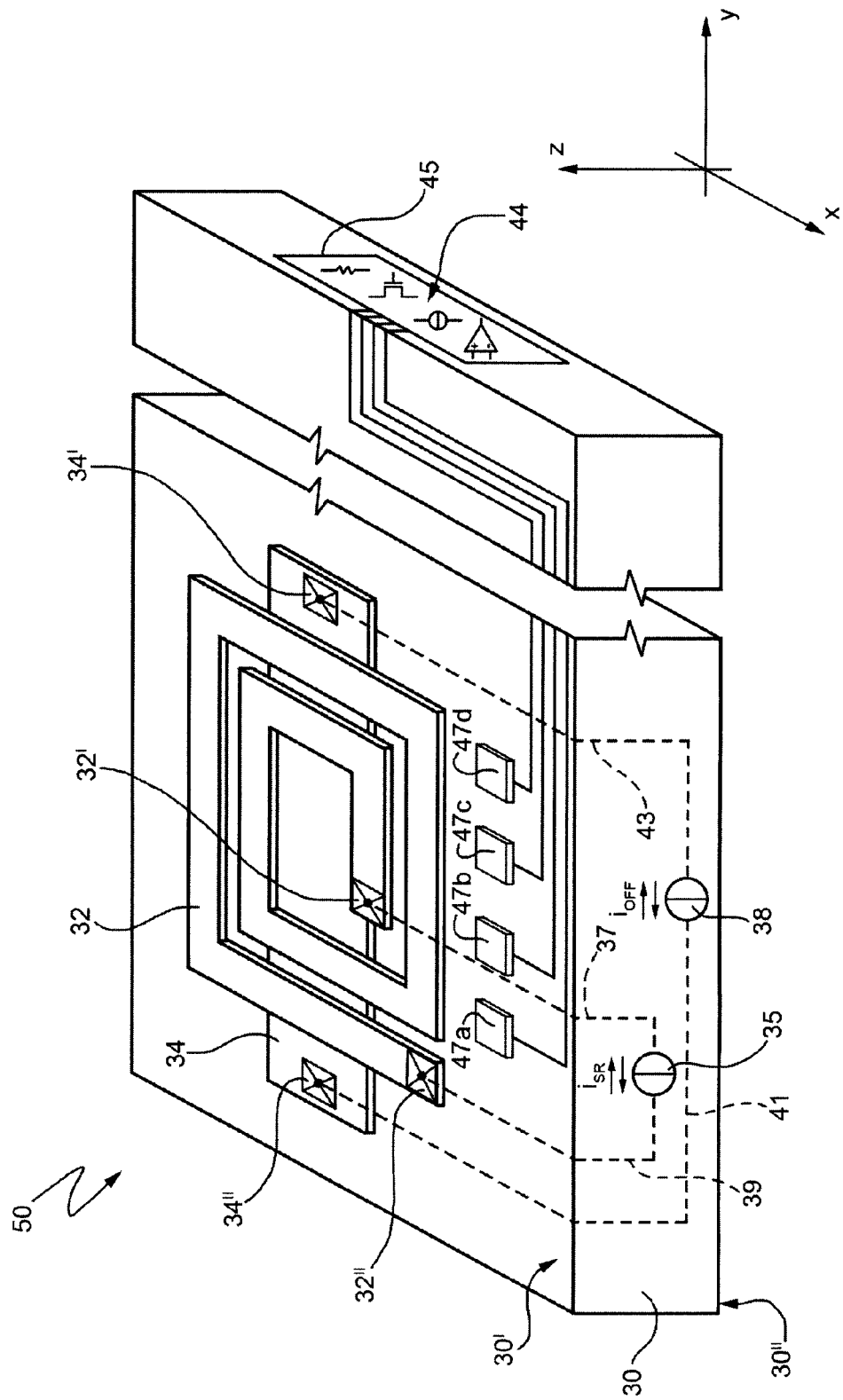
FIG. 2 shows, in perspective view and not in scale, an ASIC chip comprising straps of an AMR sensor, according to one embodiment of the present disclosure.
Figure 3:
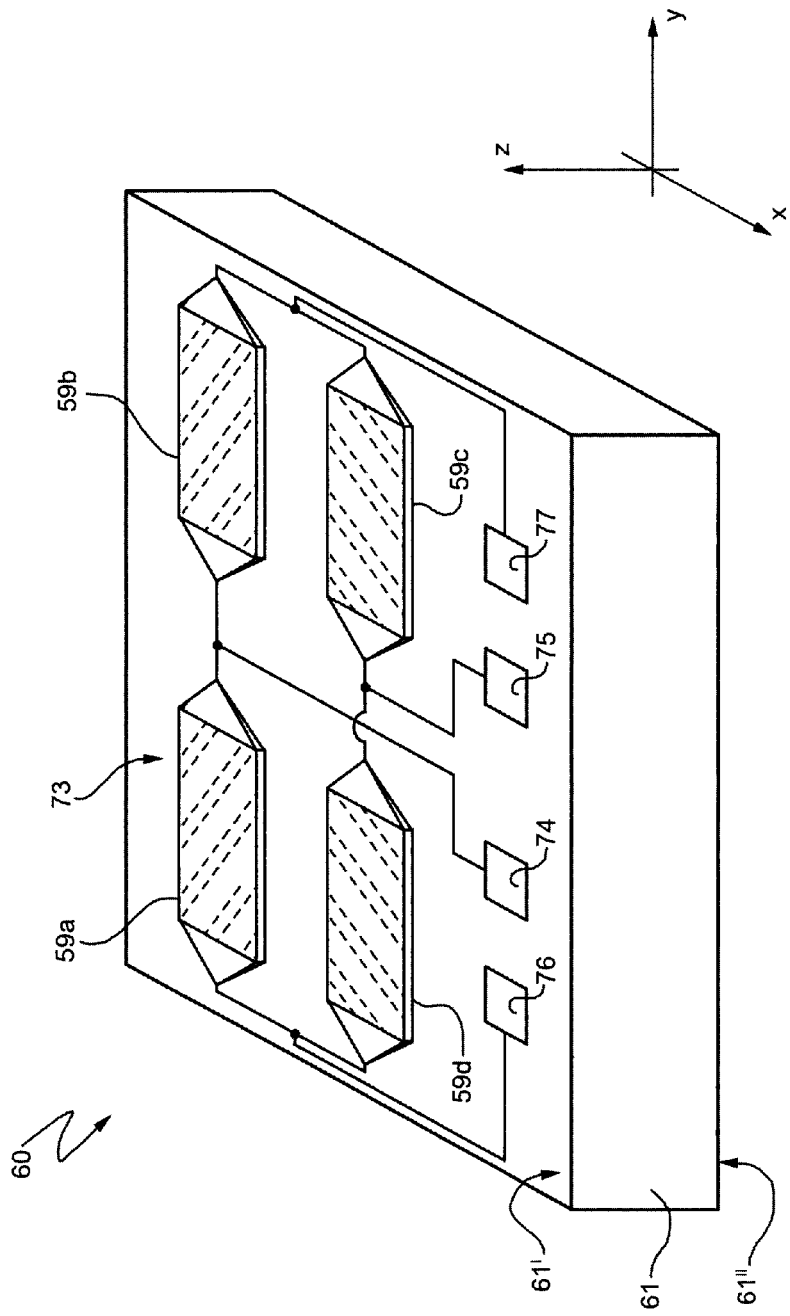
FIG. 3 shows, in perspective view and not in scale, a chip comprising magnetoresistive elements in Wheatstone-bridge configuration according to one embodiment of the present disclosure.

FIG. 2 is a schematic illustration of an ASIC (application-specific integrated circuit) chip 50, carrying an ASIC 45 for reading and/or electrical biasing of one or more magnetoresistive elements. The ASIC 45 is of a type integrated in a semiconductor substrate 30, and is configured for carrying out reading and/or electrical biasing of magnetoresistive elements in a magnetic-field sensor, of the AMR type. In particular, as described in detail with reference to FIG. 5, said magnetic-field sensor is obtained by assembling together the ASIC chip 50 and a further chip 60, distinct from the ASIC chip 50, carrying the magnetoresistive elements (FIG. 3).

The ASIC chip 50 comprises, according to an embodiment of the present disclosure, a first element 32 and a second element 34 for generation of magnetic fields. According to one embodiment, the first and second magnetic field generators 32, 34 are formed by a conductive element configured for being traversed by electric current. Each respective conductive element can have the shape of a planar strap, comprising one or more concentric turns, or the shape of a strip made of conductive material, or any other shape. In what follows, the first magnetic field generator 32 will be referred to as "set/reset strap", and the second magnetic field generator 34 will be referred to as "offset strap". The set/reset strap 32 and the offset strap 34 are formed in respective top metal layers of the ASIC chip 50, in the proximity of a top face 30' of the substrate 30, opposite to a bottom face 30" of the substrate 30. By "substrate" 30 is here meant a machined semiconductor substrate, in particular comprising a plurality of layers of materials deposited and/or grown, according to known micromachining techniques. For the purposes of the present description, the top face 30' is indifferently the face resulting at the end of steps of machining of the substrate 30 or a face of the substrate 30 in an intermediate manufacturing step. In particular, according to one embodiment of the present disclosure, the top face 30' comprises a passivation layer including conductive pads.

It is evident that the turns of the set/reset strap 32 and of the offset strap 34 can have a shape different from the one shown in FIG. 2 (for example, they can have a rectilinear, circular, or generically polygonal shape), and can be set so as to be, in top plan view, completely or only partially superimposed on one another, or set alongside one another. In addition, the set/reset strap 32 and the offset strap 34 can comprise any number of turns, even just one turn. The set/reset strap 32 and the offset strap 34 are provided according to standard process steps, already used in processes for fabrication of semiconductors devices, such as for example CMOSs or BCDs (bipolar-CMOS-DMOS) processes, hence without increasing the complexity of the sensor and the manufacturing costs, and maintaining the compatibility with standard micromachining processes.

In addition, given that, normally, the last metal level is thicker than the others and hence has a lower specific resistance, the set/reset strap 32 will draw as a whole advantage also from this standpoint. It is in fact desirable to have the lowest possible (parasitic) resistance in order to facilitate generation of the current pulse and passage of this pulse across the terminals of the coil.

According to the embodiment of FIG. 2, the set/reset strap 32 has a first conductive portion extending parallel to the direction of the axis X, and a second conductive portion, electrically coupled to the first conductive portion, extending parallel to the direction of the axis Y, in particular orthogonal to the direction of extension of the first portion. In addition, the set/reset strap 32 has a first terminal 32' and a second terminal 32" connected to respective terminals of a current generator 35, integrated in the ASIC chip 50 and configured for generating a current pulse $i_{SR}$ through the set/reset strap 32.

In use, when the current pulse $i_{SR}$ flows in the first conductive portion of the strap 32 in the direction defined by the axis X, a local magnetic field is generated having lines of flow orthogonal to the direction of flow of the current $i_{SR}$, and in particular, in the plane XY, in the direction defined by the axis Y. In addition, since the first and second conductive portions are connected to one another, the current $i_{SR}$, by flowing in the second conductive portion of the strap 32, generates locally a magnetic field having lines of flow, in the plane XY, in the direction defined by the axis X.

The peak of the current pulse $i_{SR}$ is, for example, comprised between 150 and 500 mA, and preferably equal to 300 mA. The first terminal 32' is connected to a first terminal of the current generator 35 via a connection portion 37, made of conductive material, electrically insulated from the strap 32, for example formed in a metal level that is different from (for example, lower than) the metal level in which the strap 32 is formed.

Likewise, the second terminal 32" is connected to a second terminal of the current generator 35 via a respective connection portion 39. In a known way, the current generator 35 can be conveniently formed by an H-shaped bridge in which, inserted in series to the strap 32, between the two output terminals of said H-shaped bridge, is an external capacitance designed to generate, by differentiation of a voltage signal, the desired current pulse.

The offset strap 34, which is here in the form of a planar conductive strip, has a first terminal 34' and a second terminal 34", which are connected to respective terminals of a current generator 38. The current generator 38 is integrated in the ASIC chip 50 and is configured for causing flow of a current $i_{OFF}$, for example comprised between 1 mA and 10 mA, preferably, 10 mA, in the offset strap 34. The first and second terminals 34', 34" are connected to the current generator 38 via a respective connection portion 41, 43, made of conductive material.

In use, the current $i_{OFF}$ generates a magnetic field having lines of flow, in the plane XY, parallel to the direction defined by the axis X.

The offset strap 34 is formed in a metal level different from the one in which the set/reset strap 32 is formed. In particular, the offset strap 34 is conveniently provided in a metal level lower than the metal level in which the strap 32 is formed, it being less critical from the standpoint of the current that traverses it and functionality of the magnetic-field sensor. The set/reset strap 32 has in fact the purpose of generating the maximum magnetic field possible in order to orient the magnetic dipoles of the magnetoresistive elements, whereas the offset strap 34 has the purpose of generating a magnetic field of the order of the field detected by the sensor in order to carry out a minor variation or correction of the orientation of the dipoles. This field is hence of much lower intensity than the set and reset field.

Since the magnetic-field sensor according to the present disclosure is formed (see FIG. 5) by assembling the ASIC chip 50 with the chip 60 that carries the magnetoresistive elements (the chip of FIG. 3), it follows that it is convenient to set the set/reset strap 32 as close as possible to the magnetoresistive elements, and hence, in the highest metal level, whereas the offset strap 34, which is less critical, can be implemented in a lower metal level.

The ASIC chip 50 further comprises a plurality of active and/or passive electronic components integrated in the substrate 30, shown schematically by way of example in the figure and designated by the reference number 44.

In particular, the electronic components 44 form an ASIC 45 for supply and/or reading of a magnetic-field sensor, in particular of a sensor of the AMR type. The ASIC 45 is configured for supplying an input signal $V_{AL}$ designed to bias the magnetoresistive elements of the magnetic-field sensor and reading an output signal $V_{OUT}$ generated by the magnetoresistive elements of the sensor itself in response to the input signal $V_{AL}$ and to a (possible) external magnetic field to be detected.

Figure 5:
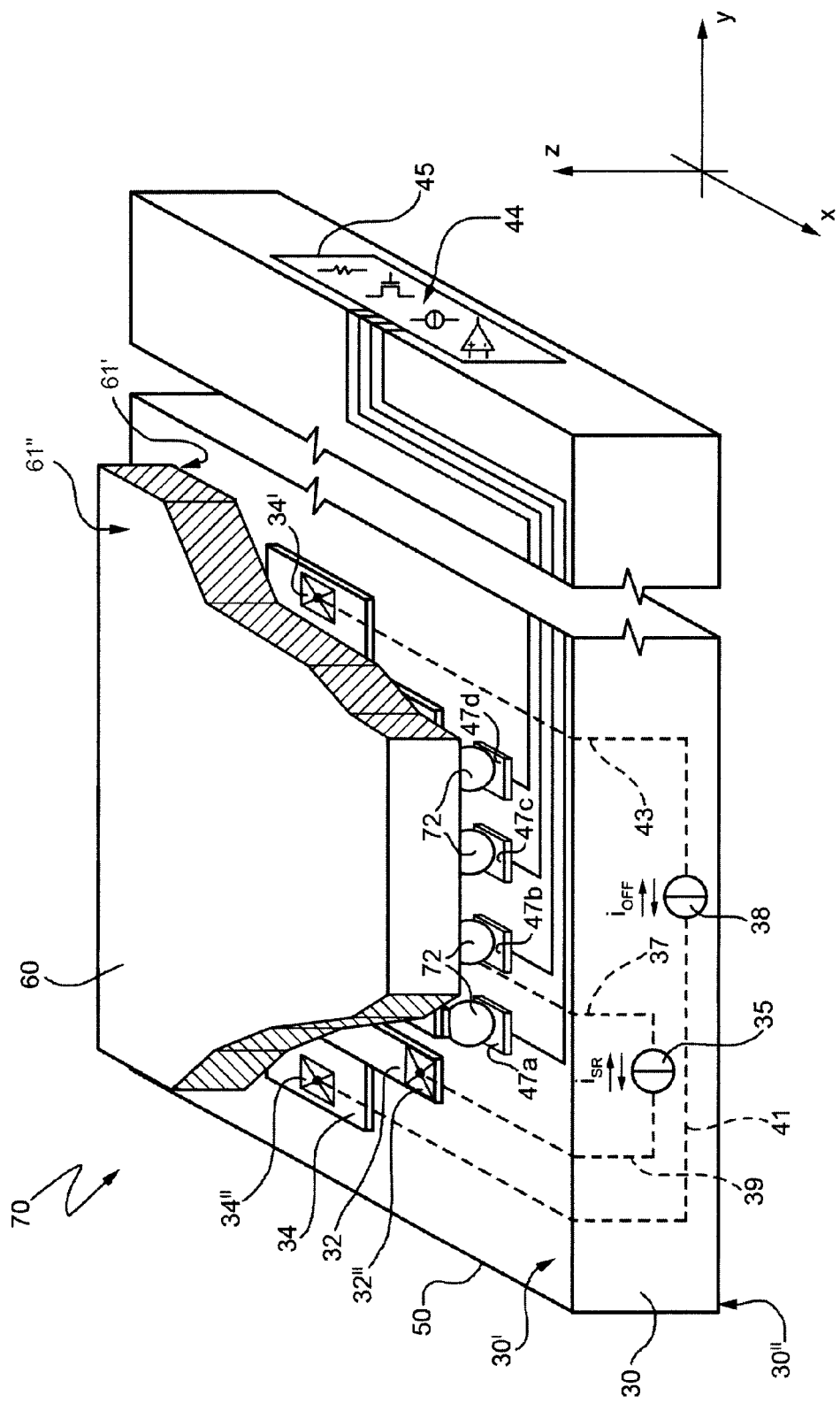
FIG. 5 shows a magnetic-field sensor formed by assembling the chips of FIGS. 2 and 3, according to one embodiment of the present disclosure.
Figure 6:
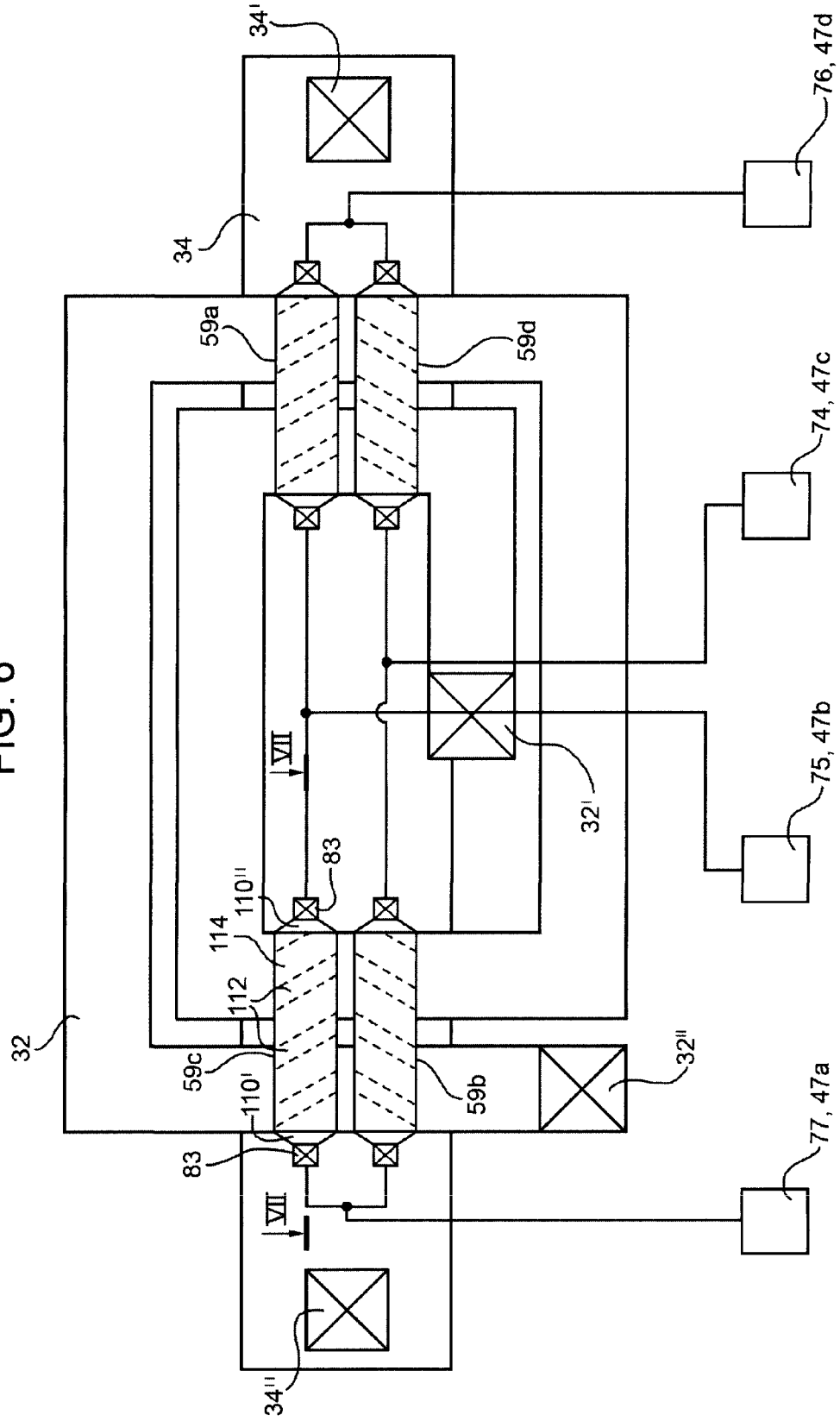
FIG. 6 shows, in top plan view and not in scale, the mutual arrangement between the straps carried by the ASIC chip of FIG. 2 and the magnetoresistive elements carried by the chip of FIG. 3 when said chips are assembled to form the magnetic-field sensor of FIG. 5.
Figure 7:
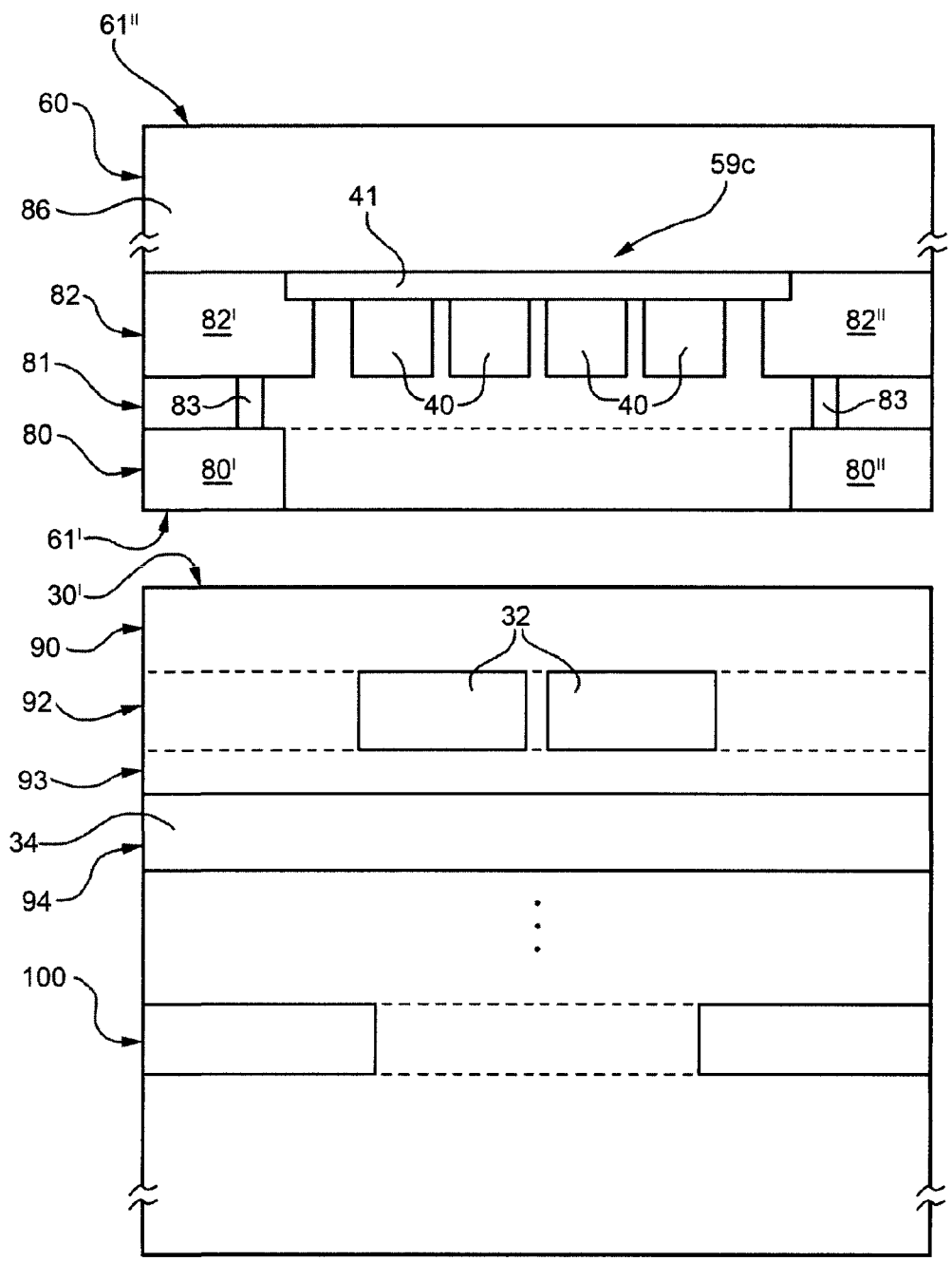
FIG. 7 shows a cross-sectional view, not in scale, of the sensor of FIG. 5 and FIG. 6, taken along the line of section VII-VII of FIG. 6.

According to the present disclosure, the magnetoresistive elements are connected to one another to form a Wheatstone bridge and are implemented in integrated form in a substrate 61 different from the substrate 30 of the ASIC chip 50, and can be connected to the ASIC 45 by means of bumps (see for example FIGS. 5-7 and the corresponding description). For this purpose, the substrate 30 has on the top surface 30' a plurality of pads (four pads 47a, 47b, 47c, 47d are shown in FIG. 2), connected to the ASIC 45 and configured for acting as interface between the ASIC 45 and the bumps and, via the latter, with the magnetoresistive elements.

The ASIC 45 is of a known type and comprises, for example, resistive or switched-capacitor differential or fully-differential front-ends, or in any case any circuit known in the literature designed to read differential signals generated by a Wheatstone bridge. Since the ASIC 45 is of a known type and does not form the subject of the present disclosure, is not described herein any further.

FIG. 3 shows the magnetoresistive chip 60 according to an embodiment of the present disclosure. The embodiment of the magnetoresistive chip 60 of FIG. 3 shows four magnetoresistive elements 59a-59d connected to one another in Wheatstone-bridge configuration 73. The magnetoresistive elements 59a-59d are oriented so as to be sensitive to magnetic fields having lines of force oriented along a first axis (e.g., axis X), to form a uniaxial sensor.

The magnetoresistive elements 59a-59d are implemented in integrated form in the semiconductor substrate 61, in the proximity of a top face 61' of the substrate 61, by means of micromachining processes of a known type.

In a way similar to what has been said with reference to FIG. 2, the substrate 61 can be of a machined type. In this case, the top face 61' is indifferently the face resulting at the end of said manufacturing steps or resulting at the end of any one of the manufacturing steps.

Each of the magnetoresistive elements 59a-59d is formed as one or more strips of ferromagnetic material (for example deposited thin films comprising an Ni/Fe alloy), in a barber-pole configuration. In FIG. 3 the barber-pole structure is represented schematically by dashed lines.

The magnetoresistive elements 59a-59d are connected to one another to form a Wheatstone-bridge structure 73, and are moreover connected to pads 74-77, for supplying an input signal $V_{AL}$ to the Wheatstone-bridge structure 73 and acquiring an output signal $V_{OUT}$. In use, the supply signal $V_{AL}$ is applied between the pad 76 and the pad 77. Reading of the output signal $V_{OUT}$ is made between the pad 74 and the pad 75.

Figure 1:
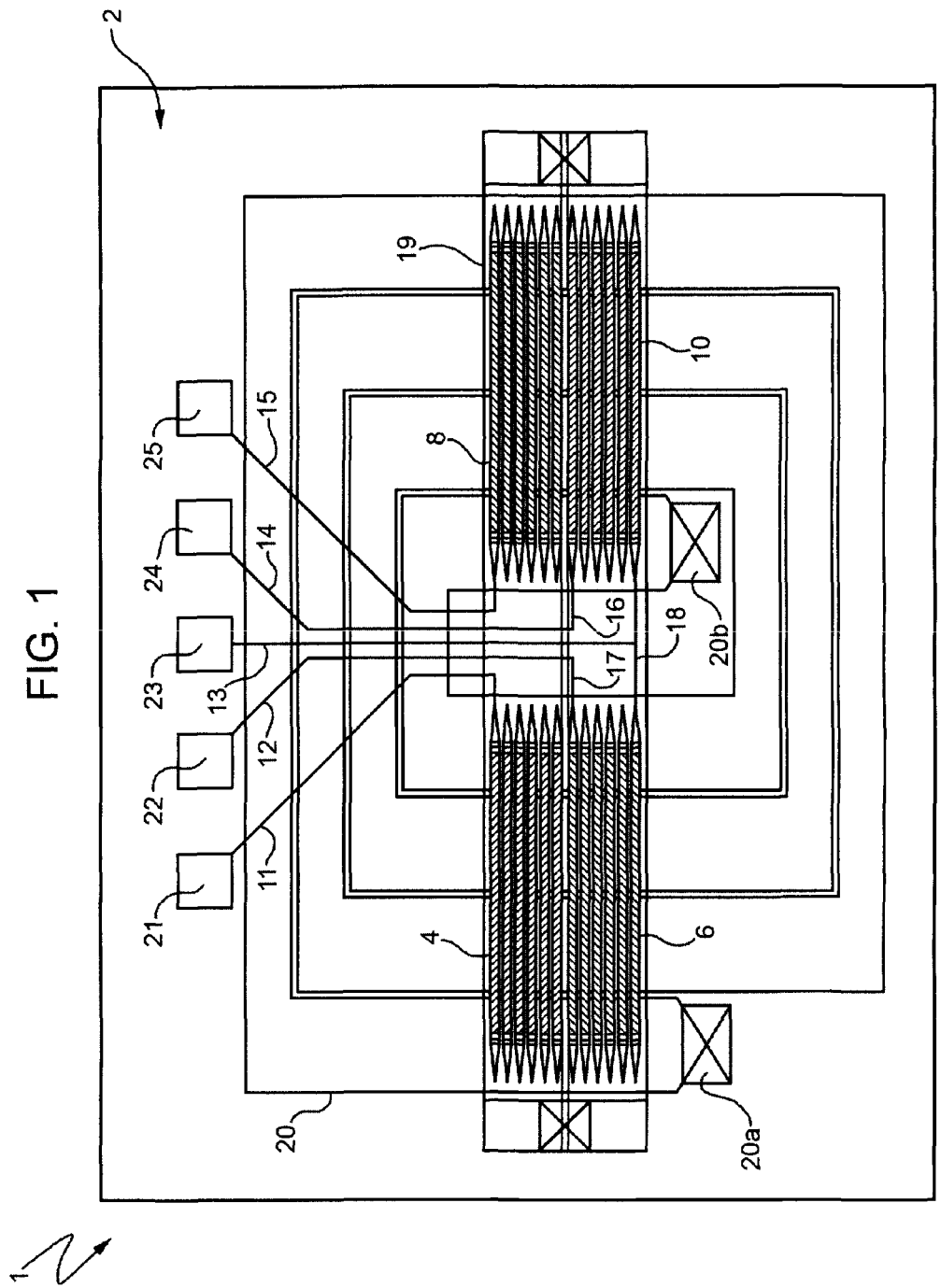
FIG. 1 shows, in top plan view, a magnetic-field sensor comprising magnetoresistive elements according to an embodiment of a known type.

The Wheatstone-bridge structure 73 of FIG. 3 is similar to the bridge structure shown and described with reference to FIG. 1.

The connections between the magnetoresistive elements 59a-59d and the pads 74-77 are shown schematically in FIG. 3. It is evident that said connections can be provided according to a plurality of embodiments, for example on different metal levels, and/or so as to optimize the space occupied, and/or so as to reduce the parasitic capacitances, or to satisfy yet further requirements. According to an embodiment of the present disclosure, the connections between the magnetoresistive elements 59a-59d and the pads 74-77 are formed, together with the barber-pole structure of the magnetoresistive elements, in a single metal level so as to simplify the steps for fabrication of the sensor.

Figure 4:
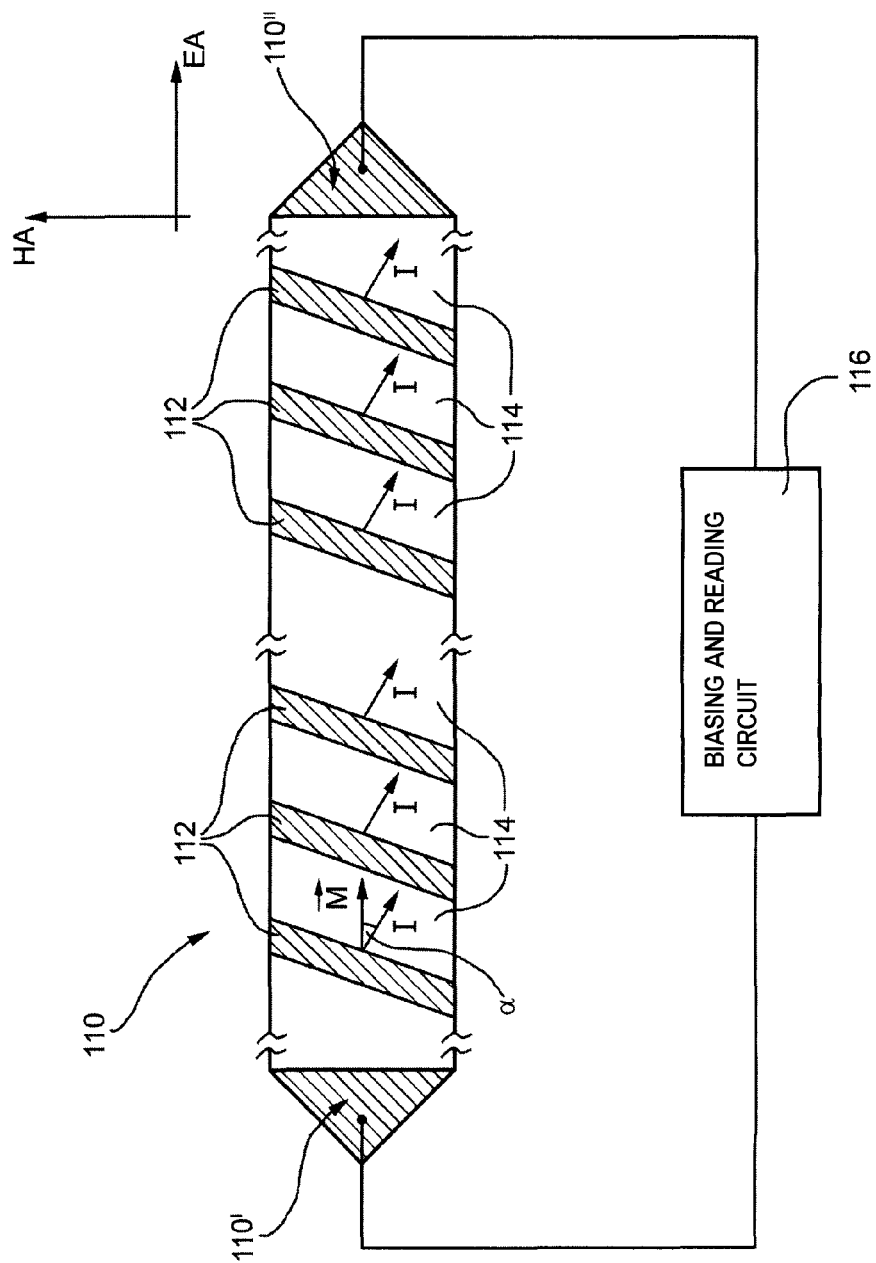
FIG. 4 shows, in top plan view, a magnetoresistive element in a barber-pole configuration.

FIG. 4 shows, in top plan view, a magnetoresistive element 110 (provided by way of example of any of the magnetoresistive elements 59a-59d). The magnetoresistive element 110 comprises a portion 114 made of magnetoresistive material (for example, a nickel and iron alloy, more in particular, Permalloy) in ohmic contact with a barber-pole structure 112, with high electrical conductivity (for example, made of metal, such as aluminium, silver, gold, etc.). The elements of the barber-pole structure 112 are inclined by a certain angle α (typically, α=45°) with respect to the axis of spontaneous magnetization of the magnetoresistive element (indicated in the figure by means of the vector M).

The magnetoresistive element 110 possesses terminal portions 110' and 110", in electrical connection with the magnetoresistive portion 114, which can be connected to a biasing and reading circuit 116, for example comprising a voltage generator and belonging to the ASIC 45. The terminal portions 110' and 110" are preferably provided with a respective metal contact region, designed to favor electrical contact between the magnetoresistive portion 114 and the biasing and reading circuit 116. In use, with the terminal portions 110' and 110" connected to the voltage generator, a current (represented in the figure by the vector I) flows between the terminal portion 110' and the terminal portion 110". As a result of the barber-pole structure, the current vector I, indicating the flow of current between facing elements of the barber-pole structure 112, is oriented so as to present an angle α with the magnetization vector M.

A possible magnetic field having a component of field perpendicular to the easy axis EA (i.e., parallel to the hard axis HA), applied to the magnetoresistive element 110, causes a rotation of the magnetization vector M and a consequent variation of the value of the angle α. This consequently causes a variation of the electrical resistance of the magnetoresistive element 110 (also referred to as "magnetoresistive effect") and can be detected by acquiring and analysing an output signal (e.g., a voltage signal) picked up across the terminal portions 110' and 110". What is described here with reference to a single magnetoresistive element can be obviously applied to a plurality of magnetoresistive elements connected in Wheatstone-bridge configuration.

FIG. 5 shows a magnetic-field sensor 70 formed by assembling the ASIC chip 50 and the magnetoresistive chip 60. In order to operate the magnetoresistive chip 60, the ASIC chip 50 and the magnetoresistive chip 60 are arranged facing one another, in particular with the top face 30' of the substrate 30 directly facing the top face 61' of the substrate 61. In this way, the magnetoresistive elements 59a-59d are, in top plan view and in a direction defined by the axis Z, close to the set/reset strap 32 and offset strap 34. In addition, the magnetoresistive elements 59a-59d and the set/reset strap 32 and offset strap 34 lie in respective planes parallel to one another (and parallel to the plane XY), and the magnetoresistive elements 59a-59d extend, in top plan view in the direction defined by the axis Z, superimposed, at least partially, on the set/reset strap 32 and offset strap 34.

The pads 74-77 of the magnetoresistive chip 60 are electrically connected to the respective pads 47a-47d of the ASIC chip 50, in particular so as to connect the ASIC 45 to the Wheatstone bridge 73, in order to supply the supply signal $V_{AL}$ to the Wheatstone bridge 73 and acquire the output signal $V_{OUT}$.

The connection between the pads 74-77 of the magnetoresistive chip 60 and the respective pads 47a-47d of the ASIC chip 50 is provided by means of connection elements 72, of a conductive type, for example bumps or pillars.

In order to ensure greater mechanical stability, there may also be provided connection elements having the sole function of mechanical, and not electrical, connection.

FIG. 6 shows a top plan view of a portion of the magnetic-field sensor 70 in order to illustrate by way of example a possible mutual arrangement between the set/reset strap 32 and offset strap 34 and the magnetoresistive elements. For greater clarity, FIG. 6 does not show in further detail the magnetoresistive chip 60 and the ASIC chip 50.

As may be noted in FIG. 6, the ASIC chip 50 and the magnetoresistive chip 60 are assembled in such a way that the magnetoresistive elements are arranged facing and vertically superimposed on the set/reset strap 32 and offset strap 34. According to one embodiment of the present disclosure, the magnetoresistive elements are arranged so as to sense longitudinal magnetic fields (generated by the straps 32 and 34); for the same reason, it may be convenient to use straps (in particular the offset strap 34) that are as wide as the ferromagnetic elements. In addition, it is preferable for the magnetic fields generated by the straps 32 and 34 to be uniform along each of the magnetoresistive elements.

FIG. 7 shows a cross-sectional view of the sensor of FIGS. 5 and 6, taken along the line of section VII-VII of FIG. 6.

The magnetoresistive chip 60 comprises a layer 80, for interface towards the outside world, for example obtained with the passivation technique. The passivation layer 80 (made, for example, of silicon oxide with a thickness of some micrometers, e.g., 4 μm) houses conductive connections 80' and 80" (for example, some or all of the connections that connect the magnetoresistive elements 59a-59d with the pads 74-77), and the pads 74-77 themselves, made of conductive material, for example metal, such as copper and/or aluminium.

As we move away from the top face 61', beyond the passivation layer 80, there extends an interconnection layer 81. The interconnection layer 81 is made of dielectric material (e.g., silicon oxide with a thickness of some tens of nanometers, typically 50 nm), and houses a plurality of vias 83. As we move further away from the face 61', beyond the interconnection layer 81, a first metal layer 82 is present, housing conductive connections 82' and 82" (with reference also to FIG. 4, said connections 82' and 82" are, for example, the terminal portions 110' and 110") and the magnetoresistive elements 59a-59d. Each magnetoresistive element 59a-59d (just the magnetoresistive element 59c is shown in the cross section of FIG. 6) comprises, in particular, the portion of ferromagnetic material 114 (which, as has been said, is typically an Ni/Fe alloy, with a thickness of some tens of nanometers, typically 20 nm) and the barber-pole structure 112 (which is, for example, made of copper and has a thickness of some hundreds of nanometers, for example 300 nm). The portion of ferromagnetic material 114 and the barber-pole structure 112 are in ohmic contact with one another.

According to a further embodiment, the passivation layer 80 housing the pads 74-77 is not present, and possible electrical connections that were to become expedient are formed in the metal layer 82.

Likewise, according to further embodiments, a number of metal levels as the ones shown in FIG. 7 may be present.

As we move away from the top face 61', beyond the metal layer 82, there can extend further layers and/or the substrate (here designated as a whole by the reference number 86) of the magnetoresistive chip 60.

The ASIC chip 50 comprises, facing the top face 30', a layer of interface 90 towards the outside world, for example obtained with the passivation technique (passivation layer). The passivation layer 90, for example with a thickness comprised between 1 µm and some micrometers, houses the pads 47a-47d (not visible in the figure), made of conductive material, for example, a metal such as copper or aluminum.

As we move away from the top face 30', extending underneath the passivation layer 90 and adjacent thereto is a first metal layer 92, housing the set/reset strap 32. The set/reset strap 32 has, for example, a thickness comprised between some hundreds of nanometers and some micrometers, e.g., 900 nm. The first metal layer 92 moreover houses further connection elements and/or metal paths to form connections between the top and bottom layers (for example, this metal layer can house, at least partially, conductive connections from and towards the pads 47a-47d).

Extending underneath the first metal layer 92 and adjacent thereto is an interconnection layer 93, with a thickness of some tens of nanometers, housing conductive vias designed to form an electrical connection between the first, overlying, metal layer 92 and a second, underlying, metal layer 94.

The second metal layer 94 houses the offset strap 34. The offset strap 34 has, for example, a thickness of some hundreds of nanometers, for example, 350 nm.

Underneath the second metal layer 94 there may be present further interconnection layers, metal layers, and a substrate (designated as a whole by the reference number 100), in which the electronic components 44 (and the ASIC 45) and the current generators 35, 38 are provided, as well as all the circuitry dedicated to reading of the sensor such as for example, reading front-ends, ADCs, reference current and voltage generators, control logic, filters, memories, etc.

The connection portions 37, 39 for connection of the set/reset strap 32 to the current generator 35, and the connection portions 41, 43 for connection of the offset strap 34 to the current generator 38 are formed, in a way not shown, in the metal layers 92, 94, and/or in the bottom metal layers, indifferently.

With reference to FIGS. 5 and 6, in use, the magnetic fields generated by the set/reset strap 32 and by the offset strap 34 interact with the magnetoresistive elements 59a-59d (as described with reference to the known art), and the magnetoresistive chip 60 can be operated in a known way. The distance between the faces 30' and 61' of the ASIC chip 50 and of the magnetoresistive chip 60 is defined by the thickness of the connection elements 72 used. For example, the connection elements 72 (which, as has been said, can be bumps or pillars) comprise a copper structure having a thickness of some tens of micrometers, e.g., 45 µm, at opposite ends of which regions are formed (typically, of a tin/silver alloy and/or UBM—"under bump metallization") designed to favor adhesion (typically by means of soldering) of each connection element 72 with the pads 47a-47d of the ASIC chip 50 and with the pads 74-77 of the magnetoresistive chip 60. At the end of the soldering process, the facing surfaces (faces 30' and 61') of the ASIC chip 50 and of the magnetoresistive chip 60 are set at a distance from one another of some tens of micrometers, e.g., 50 µm.

The magnetoresistive elements 59a-59d are vertically spaced apart by the set/reset strap 32 by some tens of micrometers, e.g., approximately 50-60 µm.

From an examination of the characteristics of the disclosure provided according to the present disclosure the advantages that it affords are evident.

In particular, the parasitic capacitances deriving from excessive interconnections between the ASIC and the magnetic-field sensor are considerably reduced.

In addition, the process of production of the magnetic-field sensor is as a whole decidedly simplified in so far as the chip that houses the magnetoresistive elements does not require more than a single metal layer. Given that the magnetic-field sensor is, as is often said, pad-limited, i.e., the pads occupy a considerable part of the total area of the chip, there is a substantial saving in area due to the absence of the need to form pads for supplying the currents $i_{SR}$ and $i_{OFF}$ to the set/reset strap 32 and offset strap 34.

What has been said implies no additional cost in terms of process of fabrication of the ASIC, in so far as the metal layers used in the ASIC are already available. Instead, the reduction of the overall dimensions of the chips that house the magnetoresistive elements leads to a significant reduction in the manufacturing costs.

Finally, it is clear that modifications and variations may be made to the device described and illustrated herein without thereby departing from the sphere of protection thereof.

For example, the structure described with reference to the ASIC chip 50 (FIG. 7) may differ from the one shown. In particular, the set/reset strap 32 may be formed in metal levels different from the first metal level 94, for example in a metal level lower than that in which the offset strap 34 is formed. At the same time, the offset strap 34 may be formed in the first metal level 94, or in other underlying metal levels, indifferently.

According to a further embodiment, the magnetic-field sensor 70 of FIGS. 5-7 can comprise just one strap, for example just the set/reset strap 32, in the case where the offset strap 34 is deemed not necessary for a specific use of the magnetic-field sensor 70.

According to further embodiments, the set/reset strap 32 is formed integrated in the substrate 30 of the ASIC chip 50, whereas the offset strap 34 is formed, in a known way, integrated in the substrate 61 of the magnetoresistive chip 60. This embodiment entails the same advantages of the embodiment described with reference to FIGS. 5-7, in so far as, given that the offset strap 34 supplied for periods of time that are short as compared to those of the set/reset strap 32, the parasitic capacitances deriving from the connections between the magnetoresistive chip 60 and the ASIC chip 50 are in any case low as compared to the case where both of the straps 32, 34 are formed integrated in the magnetoresistive chip 60. In addition, in any case a saving of area is obtained as compared to the embodiments of a known type in so far as no pads for supply of the current signal $i_{SR}$ to the set/reset strap 32 are necessary.

In addition, the set/reset strap 32 and/or the offset strap 34 can be replaced with generic elements designed to generate an appropriate magnetic field.

In addition, the magnetoresistive chip 60 can comprise, as an alternative or in addition to the Wheatstone-bridge structure, a single magnetoresistive element, provided with input terminals, for supply of an electric current, and with one or more output terminals, for picking up an output signal indicating the possible variation of electrical resistance of the magnetoresistive element caused by the presence of an external magnetic field. The single magnetoresistive element can be implemented as a plurality of magnetoresistive sub-elements connected in series to one another, as is for example shown in FIG. 1 with reference to the magnetoresistive elements 4, 6, 8, and 10.

According to further embodiments, not shown, the magnetoresistive chip 60 can comprise, as an alternative or in addition to the Wheatstone-bridge structure and/or to the single magnetoresistive element, two or three magnetoresistive elements, connected in parallel to one another.

According to further embodiments of the present disclosure, the magnetoresistive chip 60 comprises a second Wheatstone bridge formed by respective magnetoresistive elements. In use, the second Wheatstone bridge is coupled to respective set/reset and offset straps housed in the ASIC chip 50. The magnetoresistive elements of the second Wheatstone bridge are oriented so as to be sensitive to magnetic fields having lines of force oriented along a second axis (e.g., axis Y) different from the first axis (e.g., axis X of detection of the Wheatstone bridge 73). For example, the first and second axes can be orthogonal to one another. A biaxial sensor is thus formed.

Alternatively, a monolithic biaxial sensor can be formed using a single pair of straps (one strap for set/reset and one strap for offset compensation) for both of the axes of detection X and Y.

Finally, even though, as has been said, it is preferable for the magnetoresistive elements 59a-59d to be vertically aligned to the set/reset strap 32 and offset strap 34 (i.e., aligned along the axis Z) so as to sense a longitudinal field, this is not strictly necessary for the purposes of the present disclosure; it is, in fact, sufficient for the magnetoresistive elements 59a-59d to sense the magnetic fields generated, in use, by the set/reset strap 32 and offset strap 34.

Consequently, the magnetoresistive elements and the set/reset strap 32 and offset strap 34 can even be only partially vertically aligned.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A magnetic-field sensor to detect an external magnetic field, the sensor comprising:
    a first chip having a first surface and a second surface, the first chip including a first magnetoresistive structure configured to detect said external magnetic field and a first electrical-contact terminal that is coupled to the first magnetoresistive structure, the first magnetoresistive structure being closer to the first surface than to the second surface of the first chip; and
    a second chip housing an integrated electronic circuit and a first magnetic-field generator, the second chip having a first surface and a second surface, the first magnetic-field generator being closer to the first surface than to the second surface of the second chip, the first surface of the first chip facing the first surface of the second chip, the integrated electronic circuit configured to be electrically coupled to the first electrical-contact terminal of the first magnetoresistive structure and the first magnetic-field generator configured to magnetically couple to the first magnetoresistive structure.

2. The sensor according to claim 1, wherein the first magnetoresistive structure has a primary magnetization axis and a secondary magnetization axis orthogonal to one another, the first magnetic-field generator being configured to generate a magnetic field having field lines along the primary magnetization axis of the first magnetoresistive structure.

3. The sensor according to or claim 2, wherein the second chip further includes a second magnetic-field generator configured to magnetically couple to the first magnetoresistive structure and generate a magnetic field having field lines along the secondary magnetization axis of the first magnetoresistive structure.

4. The sensor according to claim 3, wherein the second magnetic-field generator comprises a planar winding including one or more concentric turns of conductive material, or a planar strip of conductive material.

5. The sensor according to claim 2, wherein:
    the first chip further includes a second magnetoresistive structure and a second electrical-contact terminal, the second magnetoresistive structure having a primary magnetization axis extending orthogonal to the primary magnetization axis of the first magnetoresistive structure, and a secondary magnetization axis extending orthogonal to the secondary magnetization axis of the first magnetoresistive structure; and
    the first and second chips are arranged to have the integrated electronic circuit be further electrically coupled to the second electrical-contact terminal of the second magnetoresistive structure and the first magnetic-field generator is configured to magnetically couple to the second magnetoresistive structure, the first magnetic-field generator being further configured to generate a magnetic field having field lines along the primary magnetization axis of the second magnetoresistive structure.

6. The sensor according to claim 5, wherein the second magnetoresistive structure includes only a single magnetoresistive element.

7. The sensor according to claim 5, wherein the second magnetoresistive structure includes a plurality of magnetoresistive elements connected to one another to form a Wheatstone bridge.

8. The sensor according to claim 1, wherein the first magnetic-field generator comprises a planar winding including one or more concentric turns of conductive material, or a planar strip of conductive material.

9. The sensor according to claim 1, wherein the first chip further comprises a second electrical-contact terminal coupled to the first magnetoresistive structure, the integrated electronic circuit being configured to generate a flow of electric current between the first electrical-contact terminal and the second electrical-contact terminal and detect a variation in a value of electrical resistance of the first magnetoresistive structure to the passage of said flow of electric current, the value of electrical resistance of the first magnetoresistive structure being representative of a value of said external magnetic field.

10. The sensor according to claim 1, wherein the first magnetoresistive structure includes only a single magnetoresistive element.

11. The sensor according to claim 1, wherein the first magnetoresistive structure includes a plurality of magnetoresistive elements connected to one another to form a Wheatstone bridge.

12. The sensor according to claim 1, further comprising a connection element, the first surface of the first chip and the first surface of the second chip being mechanically connected by the connection element.

13. The sensor according to claim 12, wherein the connection element is a solder bump or a pillar bump.

14. The sensor according to claim 12, wherein the connection element is electrically coupled to the first electrical-contact terminal.

15. A method for manufacturing a magnetic-field sensor for detecting an external magnetic field, comprising:
    forming a magnetoresistive structure for detecting the external magnetic field and an electrical-contact terminal in a first substrate, the first substrate having a first surface and a second surface, the forming the magnetoresistive structure including:

forming the magnetoresistive structure closer to the first surface than to the second surface of the first substrate;

forming an integrated electronic circuit and a first magnetic-field generator in a second substrate, the second substrate having a first surface and a second surface, the forming of the first magnetic-field generator including:
forming the first magnetic-field generator closer to the first surface than to the second surface of the second substrate;

positioning the first surface of the first substrate facing the first surface of the second substrate to have the magnetoresistive structure magnetically couple to the first magnetic-field generator; and electrically coupling the integrated electronic circuit to the electrical-contact terminal of the magnetoresistive structure.

16. The method according to claim 15, wherein the magnetoresistive structure has a primary magnetization axis and a secondary magnetization axis orthogonal to one another, and positioning the first surface of the first substrate facing the first surface of the second the first surface of the first substrate facing the first surface of the second substrate includes arranging the first magnetic-field generator and the magnetoresistive structure with respect to one another to have the magnetic field generated by the first magnetic-field generator have field lines along the primary magnetization axis of the magnetoresistive structure.

17. The method according to claim 15, further comprising forming, in the second substrate, a second magnetic-field generator configured to be magnetically coupled to the magnetoresistive structure.

18. A device, comprising:
a magnetic-field sensor to detect an external magnetic field, the sensor including:
a first chip having a first surface and a second surface that is opposite to the first surface, the first surface and the second surface being substantially parallel to each other, the first chip including a first magnetoresistive structure positioned closer to the first surface than to the second surface, the first magnetoresistive structure to detect the external magnetic field; and
a second chip having a first surface and a second surface that is opposite to the first surface, the first surface and the second surface being substantially parallel to each other, the second chip including first and second magnetic-field generators, the first and second magnetic-field generators being closer to the first surface than to the second surface of the second chip, the first surface of the first chip facing the first surface of the second chip, the first surface of the first chip being spaced from the first surface of the second chip by a distance, the first and second magnetic-field generators are configured to magnetically couple to the first magnetoresistive structure, the first magnetic-field generator being configured to generate a first magnetic field having field lines along a main magnetization axis of the first magnetoresistive structure and the second magnetic-field generator being configured to generate a second magnetic field having field lines along a secondary magnetization axis of the first magnetoresistive structure.

19. The device according to claim 18, wherein:
the first chip further includes a second magnetoresistive structure, the second magnetoresistive structure having a main magnetization axis extending orthogonal to the main magnetization axis of the first magnetoresistive structure, and a secondary magnetization axis extending orthogonal to the secondary magnetization axis of the first magnetoresistive structure; and
the first and second chips are arranged with respect to one another in such a way that the first magnetic-field generator is configured to magnetically couple to the second magnetoresistive structure, the first magnetic-field generator being further configured to generate a magnetic field having field lines along the main magnetization axis of the second magnetoresistive structure.

20. The device according to claim 19, wherein the second magnetoresistive structure includes a plurality of magnetoresistive elements connected to one another to form a Wheatstone bridge.

21. The device according to claim 18, wherein the first chip includes an electrical-contact terminal that is on the first surface of the first chip and the second chip further includes an integrated electronic circuit and an electrical-contact terminal on the first surface of the second chip, the first magnetoresistive structure being electrically coupled to the integrated electronic circuit by the electrical-contact terminal of the first chip and the electrical-contact terminal of the second chip.

* * * * *